US012660332B2

(12) United States Patent
Hu et al.

(10) Patent No.: US 12,660,332 B2
(45) Date of Patent: Jun. 16, 2026

(54) LATERALLY STRUCTURED AVALANCHE PHOTODETECTOR AND MANUFACTURING METHOD THEREFOR

(71) Applicant: Wuhan Optical Valley Information Optoelectronics Innovation Center Co., Ltd, Wuhan (CN)

(72) Inventors: Xiao Hu, Wuhan (CN); Xi Xiao, Wuhan (CN); Daigao Chen, Wuhan (CN); Lei Wang, Wuhan (CN); Yuguang Zhang, Wuhan (CN); Miaofeng Li, Wuhan (CN)

(73) Assignee: Wuhan Optical Valley Information Optoelectronics Innovation Center Co., Ltd., Wuhan (CN)

( * ) Notice: Subject to any disclaimer, the term of this patent is extended or adjusted under 35 U.S.C. 154(b) by 580 days.

(21) Appl. No.: 18/005,683

(22) PCT Filed: Dec. 14, 2020

(86) PCT No.: PCT/CN2020/136025
§ 371 (c)(1),
(2) Date: Jan. 17, 2023

(87) PCT Pub. No.: WO2022/021741
PCT Pub. Date: Feb. 3, 2022

(65) Prior Publication Data
US 2023/0282758 A1 Sep. 7, 2023

(30) Foreign Application Priority Data
Jul. 30, 2020 (CN) .......................... 202010753430.6

(51) Int. Cl.
*H10F 30/225* (2025.01)
*H10F 71/00* (2025.01)
(Continued)

(52) U.S. Cl.
CPC ......... *H10F 30/225* (2025.01); *H10F 71/121* (2025.01); *H10F 77/122* (2025.01); *H10F 77/206* (2025.01); *H10F 77/413* (2025.01)

(58) Field of Classification Search
CPC .... H10F 71/121; H10F 30/225; H10F 77/122; H10F 77/206; H10F 77/413
See application file for complete search history.

(56) References Cited

U.S. PATENT DOCUMENTS 9,437,759 B2 9/2016 Baehr-Jones
9,553,222 B2 1/2017 Baehr-Jones
(Continued)

FOREIGN PATENT DOCUMENTS

CN 201885758 U 6/2011
CN 105576072 A 5/2016
(Continued)

OTHER PUBLICATIONS

Improved translation of IDS reference CN 111933742 B, published Nov. 13, 2020.*
(Continued)

*Primary Examiner* — Suberr L Chi
(74) *Attorney, Agent, or Firm* — COOPER LEGAL GROUP LLC

(57) ABSTRACT

A laterally structured avalanche photodetector and a manufacturing method therefor. The laterally structured avalanche photodetector comprises: a substrate, comprising a first semiconductor material region (103), an avalanche region (115) being formed in the first semiconductor material region (103); a first epitaxial growth layer (120), formed as an absorption region (180), the upper surface of the first epitaxial growth layer (120) being a light absorption surface and protruding from the upper surface of the first semiconductor material region (103), and the lower surface of the
(Continued)

first epitaxial growth layer (120) being lower than the upper surface of the first semiconductor material region (103); and a second epitaxial growth layer (130), at least comprising a first portion and a second portion which are located at two sides of the first epitaxial growth layer (120) in a first direction, the first portion and the second portion respectively covering two side walls of the first epitaxial growth layer (120) protruding above the first semiconductor material region (103), the first portion and the second portion being respectively formed as at least a part of a first charge region (113) and at least a part of a second charge region (114), and the first charge region (113), the absorption region (180), the second charge region (114) and the avalanche region (115) at least partially overlapping in the first direction.

10 Claims, 7 Drawing Sheets

(51) Int. Cl.
| | |
|---|---|
| *H10F 77/122* | (2025.01) |
| *H10F 77/20* | (2025.01) |
| *H10F 77/40* | (2025.01) |

(56) References Cited

U.S. PATENT DOCUMENTS

| | | | |
|---|---|---|---|
| 9,748,429 | B1 | 8/2017 | Davids |
| 9,755,096 | B2 | 9/2017 | Novack |
| 9,812,598 | B2 | 11/2017 | Baehr-Jones |
| 10,043,927 | B2 | 8/2018 | Baehr-Jones |
| 10,217,881 | B2 | 2/2019 | Baehr-Jones |
| 10,529,878 | B1 | 1/2020 | Baehr-Jones |
| 10,847,665 | B2 | 11/2020 | Baehr-Jones |
| 2015/0340538 | A1 | 11/2015 | Novack et al. |
| 2016/0155863 | A1 | 6/2016 | Baehr-Jones et al. |
| 2016/0372612 | A1 | 12/2016 | Baehr-Jones et al. |
| 2017/0104116 | A1 | 4/2017 | Baehr-Jones et al. |
| 2018/0102447 | A1 | 4/2018 | Baehr-Jones et al. |
| 2018/0342634 | A1 | 11/2018 | Baehr-Jones et al. |
| 2019/0378949 | A1 | 12/2019 | Simoyama |
| 2020/0028008 | A1 | 1/2020 | Baehr-Jones et al. |
| 2020/0168750 | A1 | 5/2020 | Baehr-Jones et al. |

FOREIGN PATENT DOCUMENTS

| | | |
|---|---|---|
| CN | 106328751 A | 1/2017 |
| CN | 106463566 A | 2/2017 |
| CN | 107068784 A | 8/2017 |
| CN | 108666382 A | 10/2018 |
| CN | 109119500 A | 1/2019 |
| CN | 111628036 A | 9/2020 |
| CN | 111933742 A | 11/2020 |
| JP | 6726248 B2 | 7/2020 |

OTHER PUBLICATIONS

International Search Report in the international application No. PCT/CN2020/136025, mailed on Apr. 26, 2021, 3 pgs.

English translation of the Written Opinion of the International Search Authority in the international application No. PCT/CN2020/136025, mailed on Apr. 26, 2021, 4 pgs.

"Frequency Response and Bandwidth Enhancement in Ge/Si Avalanche Photodiodes with over 840GHz Gain-Bandwidth-Product", Jul. 2009, Wissem Sfar Zaoui, Hui-Wen Chen, John E. Bowers, Ytmin Kang, Mike Morse, Mario J. Paniccia, Alexanerre Pauchard and Jose C. Campbell; Optics Express vol. 17, Issue 15, 9 pgs.

* cited by examiner

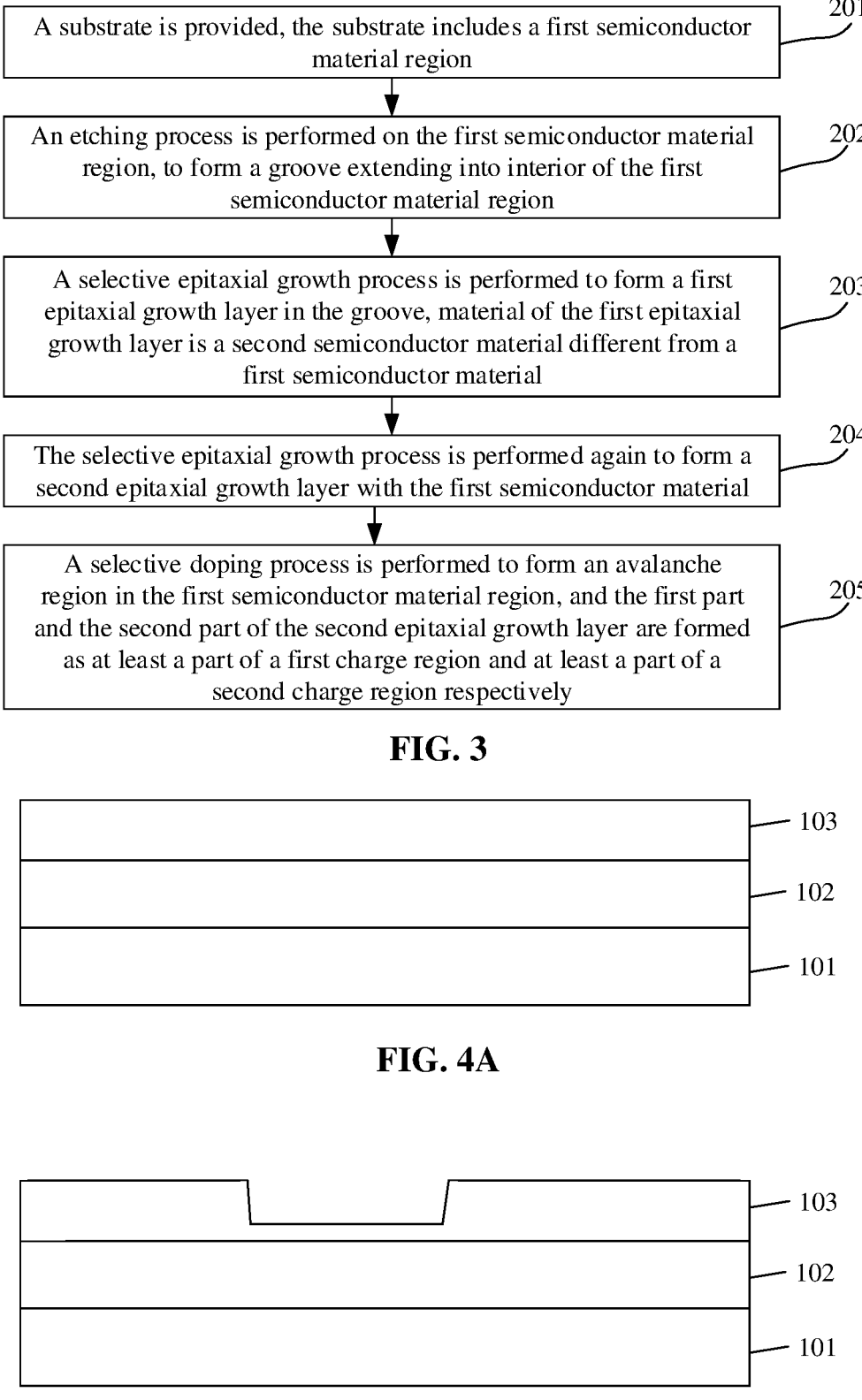

| A substrate is provided, the substrate includes a first semiconductor material region | 201 |

| An etching process is performed on the first semiconductor material region, to form a groove extending into interior of the first semiconductor material region | 202 |

| A selective epitaxial growth process is performed to form a first epitaxial growth layer in the groove, material of the first epitaxial growth layer is a second semiconductor material different from a first semiconductor material | 203 |

| The selective epitaxial growth process is performed again to form a second epitaxial growth layer with the first semiconductor material | 204 |

| A selective doping process is performed to form an avalanche region in the first semiconductor material region, and the first part and the second part of the second epitaxial growth layer are formed as at least a part of a first charge region and at least a part of a second charge region respectively | 205 |

LATERALLY STRUCTURED AVALANCHE PHOTODETECTOR AND MANUFACTURING METHOD THEREFOR

CROSS-REFERENCE TO RELATED APPLICATIONS

This application is submitted based on and claims priority to Chinese Patent Application No. 202010753430.6 filed on Jul. 30, 2020, the contents of which are hereby incorporated by reference in its entirety.

TECHNICAL FIELD

The disclosure relates to the technical field of photon integrated chip detection, and in particular to a laterally structured avalanche photodetector and a method for manufacturing the same.

BACKGROUND

Photodetector is one of the key optoelectronic devices in optical communication, optical interconnection and optoelectronic integration technologies. At present, photodetector is widely used in various fields of military and national economy, and avalanche photodetector is welcomed by the market due to its high responsiveness and sensitivity.

However, current avalanche photodetectors have shortcomings such as unideal gain bandwidth product, uneven electric field distribution in an absorption region, or the like, and thus they need to be further improved.

SUMMARY

In view of this, embodiments of the disclosure provide a laterally structured avalanche photodetector and a method for manufacturing the same, to solve at least one problem existed in the background.

In order to achieve the above purpose, technical solutions of the embodiments of the disclosure are implemented as follows.

An aspect of the embodiments of the disclosure provides a laterally structured avalanche photodetector, including a substrate, a first epitaxial growth layer, and a second epitaxial growth layer.

The substrate includes a first semiconductor material region in which an avalanche region of the avalanche photodetector is formed.

The first epitaxial growth layer is formed on the substrate with a second semiconductor material different from a first semiconductor material, and is formed as an absorption region of the avalanche photodetector, and has an upper surface used as an optical absorption surface which is protruded from an upper surface of the first semiconductor material region, and a lower surface lower than the upper surface of the first semiconductor material region, and the absorption region and the avalanche region are arranged at an interval along a first direction parallel to a substrate plane.

The second epitaxial growth layer is formed on the substrate with the first semiconductor material, and includes at least a first part and a second part which are located at two sides of the first epitaxial growth layer along the first direction, and cover two sidewalls of the first epitaxial growth layer protruding above the first semiconductor material region respectively, and are formed as at least a part of a first charge region and at least a part of a second charge region respectively.

The first charge region, the absorption region, the second charge region and the avalanche region at least partially overlap in the first direction.

In an optional embodiment of the disclosure, the substrate may be a silicon on insulator (SOI) substrate, and the first semiconductor material region may be an area where a top silicon layer of the SOI substrate is located.

The lower surface of the first epitaxial growth layer lower than the upper surface of the first semiconductor material region, specifically includes that a bottom end of the first epitaxial growth layer is embedded in the top silicon layer.

In an optional embodiment of the disclosure, the second epitaxial growth layer may be located between the first semiconductor material region and the first epitaxial growth layer, and may have one side contacted with the first semiconductor material region and the other side contacted with a respective one of the sidewalls of the first epitaxial growth layer.

In an optional embodiment of the disclosure, the second epitaxial growth layer may be provided with P-type doping.

In an optional embodiment of the disclosure, the first semiconductor material may be silicon, and the second semiconductor material may be germanium.

In an optional embodiment of the disclosure, the laterally structured avalanche photodetector may further include an optical waveguide.

The optical waveguide extends above the first epitaxial growth layer, and is separated from the upper surface of the first epitaxial growth layer by a preset distance, and includes at least a first waveguide part and a second waveguide part.

Here the first waveguide part is configured to couple an optical signal to the first epitaxial growth layer, and includes a first end for the optical signal to be input and a second end opposite to the first end along a propagation direction of the optical signal.

The second waveguide part is arranged outside the second end along the propagation direction of the optical signal, and is formed as a distributed Bragg reflector structure.

In an optional embodiment of the disclosure, the distributed Bragg reflector structure may have a periodic width of 200 nm-500 nm, and material of the optical waveguide may have a duty cycle of 30~70%.

In an optional embodiment of the disclosure, the laterally structured avalanche photodetector may further include a first metal electrode and a second metal electrode.

The first metal electrode and the second metal electrode are arranged along a direction perpendicular to the substrate plane.

The first semiconductor material region is further formed with a first contact region and a second contact region which have opposite doping types and are contacted with the first metal electrode and the second metal electrode respectively, and the first charge region, the absorption region, the second charge region and the avalanche region are located between the first contact region and the second contact region in the first direction.

A distance between any one of the first metal electrode or the second metal electrode and the optical waveguide is equal to or greater than 500 nm.

The embodiments of the disclosure further provide a method for manufacturing a laterally structured avalanche photodetector, including the following operations.

A substrate is provided, the substrate includes a first semiconductor material region.

An etching process is performed on the first semiconductor material region, to form a groove extending into interior of the first semiconductor material region.

A selective epitaxial growth process is performed to form a first epitaxial growth layer in the groove, material of the first epitaxial growth layer is a second semiconductor material different from a first semiconductor material, the first epitaxial growth layer is formed as an absorption region of the avalanche photodetector, and has an upper surface used as an optical absorption surface which is protruded from an upper surface of the first semiconductor material region.

The selective epitaxial growth process is performed again to form a second epitaxial growth layer with the first semiconductor material, the second epitaxial growth layer includes at least a first part and a second part which are located at two sides of the first epitaxial growth layer along a first direction parallel to a substrate plane, and cover two sidewalls of the first epitaxial growth layer protruding above the first semiconductor material region respectively.

A selective doping process is performed to form an avalanche region in the first semiconductor material region, and the first part and the second part of the second epitaxial growth layer are formed as at least a part of a first charge region and at least a part of a second charge region respectively, and the first charge region, the absorption region, the second charge region and the avalanche region at least partially overlap in the first direction.

In an optional embodiment of the disclosure, the substrate may be a SOI substrate, and the first semiconductor material region may be an area where a top silicon layer of the SOI substrate is located.

The operation of performing the etching process on the first semiconductor material region specifically includes the following operations. A groove with a bottom end located in the top silicon layer is formed.

In an optional embodiment of the disclosure, the groove may not be filled with the first epitaxial growth layer, and the operation of forming the second epitaxial growth layer may include the following operations.

The second epitaxial growth layer filling the groove and covering the sidewalls of the first epitaxial growth layer is formed, the second epitaxial growth layer is located between the first semiconductor material region and the first epitaxial growth layer, and has one side contacted with the first semiconductor material region and the other side contacted with a respective one of the sidewalls of the first epitaxial growth layer.

In an optional embodiment of the disclosure, the operation of performing the selective doping process may include the following operations. P-type doping is performed on the second epitaxial growth layer.

In an optional embodiment of the disclosure, the first semiconductor material may be silicon, and the second semiconductor material may be germanium.

In an optional embodiment of the disclosure, the method may further include the following operations.

An optical waveguide is formed, the optical waveguide extends above the first epitaxial growth layer, and is separated from the upper surface of the first epitaxial growth layer by a preset distance, and includes at least a first waveguide part and a second waveguide part.

Here the first waveguide part is configured to couple an optical signal to the first epitaxial growth layer, and includes a first end for the optical signal to be input and a second end opposite to the first end along a propagation direction of the optical signal.

The second waveguide part is arranged outside the second end along the propagation direction of the optical signal, and is formed as a distributed Bragg reflector structure.

In an optional embodiment of the disclosure, the distributed Bragg reflector structure may have a periodic width of 200 nm~500 nm, and material of the optical waveguide may have a duty cycle of 30~70%.

In an optional embodiment of the disclosure, the operation of performing the selective doping process may further include the following operations. A first contact region and a second contact region with opposite doping types are formed in the first semiconductor material region, and the first charge region, the absorption region, the second charge region and the avalanche region are located between the first contact region and the second contact region in the first direction.

The method may further include the following operations. A first metal electrode and a second metal electrode are formed, the first metal electrode and the second metal electrode are arranged in a direction perpendicular to the substrate plane and are contacted with the first contact region and the second contact region respectively.

Here a distance between any one of the first metal electrode or the second metal electrode and the optical waveguide is equal to or greater than 500 nm.

The laterally structured avalanche photodetector and the method for manufacturing the same are provided by the embodiments of the disclosure, here the laterally structured avalanche photodetector includes a substrate, a first epitaxial growth layer, and a second epitaxial growth layer. The substrate includes a first semiconductor material region in which an avalanche region of the avalanche photodetector is formed. The first epitaxial growth layer is formed on the substrate with a second semiconductor material different from a first semiconductor material, and is formed as an absorption region of the avalanche photodetector, and has an upper surface used as an optical absorption surface which is protruded from an upper surface of the first semiconductor material region, and a lower surface lower than the upper surface of the first semiconductor material region, and the absorption region and the avalanche region are arranged at an interval along a first direction parallel to a substrate plane. The second epitaxial growth layer is formed on the substrate with the first semiconductor material, and includes at least a first part and a second part which are located at two sides of the first epitaxial growth layer along the first direction, and cover two sidewalls of the first epitaxial growth layer protruding above the first semiconductor material region respectively, and are formed as at least a part of a first charge region and at least a part of a second charge region respectively. The first charge region, the absorption region, the second charge region and the avalanche region at least partially overlap in the first direction. In this way, in the embodiments of the disclosure, the first epitaxial growth layer is configured that the lower surface thereof is lower than the upper surface of the first semiconductor material region, so that the first charge region, the absorption region, the second charge region and the avalanche region at least partially overlap in the first direction, thereby making a more uniform electric field distribution in the absorption region, facilitating transport of photogenerated carriers, and helping to improve a gain bandwidth product; furthermore, the upper surface of the first epitaxial growth layer (i.e. the optical absorption surface) is protruded from the upper surface of the first semiconductor material region, and two sidewalls of the first epitaxial growth layer protruding above the first semiconductor material region are covered by the second epitaxial growth layer, that is, covered by the first charge region and the second charge region, so that the first epitaxial growth layer absorbs optical signals at the upper surface, and transmits electrical signals at the sidewall in the first direction, which is conducive to coupling of optical signals and pumping of photogenerated carriers. Moreover, the first charge region and the second charge region are formed by the second epitaxial growth layer, so that intensity of the electric field in the absorption region may be independently adjusted, thereby reducing a dark current of the avalanche photodetector.

Additional aspects and advantages of the embodiments of the disclosure will be partially given in the following descriptions, and of which some will become apparent from the following descriptions, or will be learned from the practice of the embodiments of the disclosure.

BRIEF DESCRIPTION OF THE DRAWINGS

FIG. 3 is a schematic flowchart of a method for manufacturing a laterally structured avalanche photodetector provided in an embodiment of the disclosure.

FIG. 4A to FIG. 4I are structural section views of devices during manufacturing of a laterally structured avalanche photodetector provided in embodiments of the disclosure.

ILLUSTRATION OF REFERENCE NUMERALS

Figure 1A:
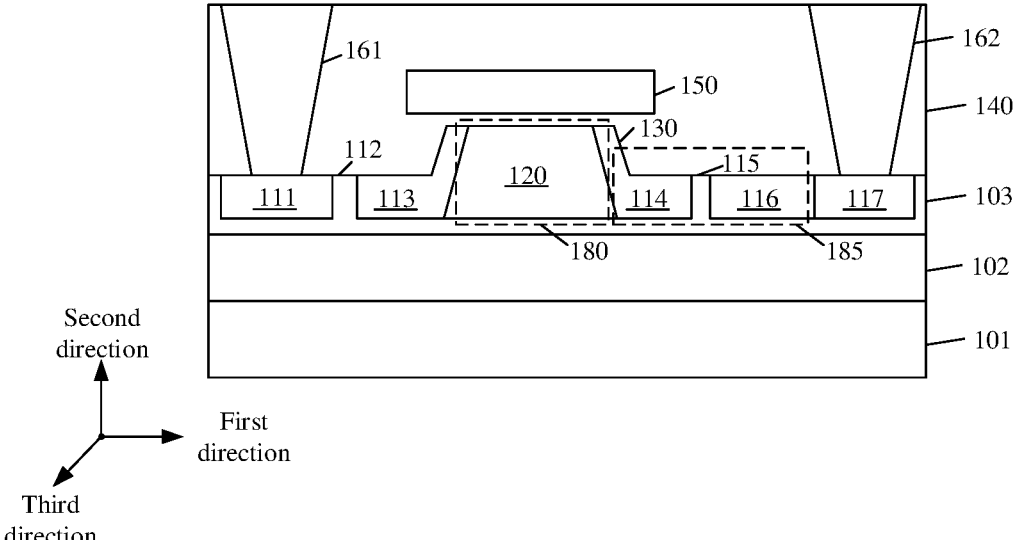
FIG. 1A and FIG. 1B are a structural section view and a top view of a laterally structured avalanche photodetector provided in embodiments of the disclosure.

101—bottom silicon layer; 102—buried oxygen layer; 103—top silicon layer;
111—first contact region; 112—first I—intrinsic region; 113—first charge region; 114—econd charge region; 115—second I—intrinsic region; 116—N+ doped region; 117—second contact region;
120—first epitaxial growth layer;
130—second epitaxial growth layer;
140—filler layer;
150—optical waveguide; 151—first waveguide part; 152—second waveguide part;
161—first metal electrode; 162—second metal electrode;
180—absorption region; 185—multiplication region.

DETAILED DESCRIPTION

Exemplary implementations disclosed in the disclosure will be described in more detail below with reference to the drawings. Although the exemplary implementations of the disclosure are shown in the drawings, it should be understood that the disclosure may be implemented in various forms and should not be limited by specific implementations set forth here. Instead, these implementations are provided to enable a more thorough understanding of the disclosure, and to fully convey the scope disclosed by embodiments of the disclosure to those skilled in the art.

In the following descriptions, a lot of specific details are given to provide a more thorough understanding of the embodiments of the disclosure. However, it will be apparent to those skilled in the art that the embodiments of the disclosure may be implemented without one or more of these details. In other examples, in order to avoid confusion with the embodiments of the disclosure, some technical features well known in the art are not described. That is, not all features of an actual embodiment are described here, and well-known functions and structures are not described in detail.

In the drawings, sizes of layers, regions and elements and their relative sizes may be exaggerated for clarity. The same reference numeral always represents the same element.

It should be understood that when an element or layer is referred as "on", "adjacent to", "connected to" or "coupled to" other elements or layers, it may be directly on, adjacent to, connected to or coupled to other elements or layers, or there may be an intervening element or layer. On the contrary, when an element is referred as "directly on", "directly adjacent to", "directly connected to" or "directly coupled to" other elements or layers, there are not intervening elements or layers. It should be understood that although terms "first", "second", "third", or the like may be used to describe various elements, components, regions, layers and/or parts, these elements, components, regions, layers and/or parts should not be limited by these terms. These terms are only intended to distinguish an element, component, region, layer or part from another element, component, region, layer or part. Therefore, a first element, component, region, layer or part as discussed below may be represented as a second element, component, region, layer or part without departing from teaching of the embodiments of the disclosure. When a second element, component, region, layer or part is discussed, it does not mean that there must be a first element, component, region, layer or part in the embodiments of the disclosure.

Spatial relationship terms such as "underneath", "beneath", "below", "under", "on", "above", or the like may be used here for convenience of descriptions, to describe relationships between an element or feature shown in the drawings and other elements or features. It should be understood that in addition to orientations shown in the drawings, the spatial relationship terms are intended to include different orientations of devices in use and operation. For example, when devices in the drawings are turned over, then elements or features described as "beneath other elements" or "under other elements" or "underneath other elements" will be oriented to be "above" other elements or features. Therefore, exemplary terms "beneath" and "underneath" may include upper and lower orientations. The device may be additionally oriented (rotated by 90 degrees or other orientations) and the spatial descriptors used here are interpreted accordingly.

Terms used here are only intended to describe specific embodiments and are not limitations of the embodiments of the disclosure. Singular forms of "a", "one" and "said/the" are also intended to include a plural form when they are used here, unless otherwise clearly indicated in the context. It should also be understood that terms "composition" and/or "including", when used in the description, determine existence of stated features, integers, steps, operations, elements and/or components, but do not exclude existence or addition of one or more other features, integers, steps, operations, elements, components and/or groups. As used here, a term "and/or" includes any and all combinations of items listed in relation thereto.

In order to fully understand the embodiments of the disclosure, detailed operations and detailed structures will be proposed in the following descriptions to elucidate technical solutions of the embodiments of the disclosure. Optional embodiments of the disclosure are described in detail as follows. However, in addition to these detailed descriptions, the disclosure may also have other implementations.

Silicon photonic technology is a new generation technology based on silicon and silicon-based substrate materials (such as SiGe/Si, SOI, or the like), which uses an existing complementary metal oxide semiconductor (CMOS) process to develop and integrate optical devices. The silicon photonic technology combines characteristics of ultra large scale and ultra-high precision manufacturing of integrated circuit technology with advantages of ultra-high speed and ultra-low power consumption of photonic technology, and is a subversive technology to deal with failure of Moore's Law. This combination is due to scalability of semiconductor wafer manufacturing, and may reduce cost. As one of the core devices of silicon photonic architecture, photodetector has a function of implementing conversation of optical signal to electrical signal. However, an energy band structure of crystalline silicon material determines that its detection efficiency in an optical communication band is very low. Although III-V group semiconductor materials are more suitable for the photodetector, III-V group semiconductor materials are incompatible with silicon process and may not be effectively integrated with silicon on a single chip. In consideration of compatibility of germanium material and CMOS process, a technology of forming a silicon germanium photodetector by using the germanium material as an optical absorption layer material is proposed in the art.

In a silicon photonic integrated chip, silicon germanium materials compatible with CMOS process may be used to implement avalanche photodetection. It uses silicon material as both an optical waveguide and an avalanche gain region. Germanium material absorbs photons.

Current avalanche photodetector structures have the following shortcomings: distribution of electric field in the absorption region of the avalanche photodetector is uneven, which leads to decrease of responsiveness; and size of the absorption region is too large, which is easy to lead to an unideal gain bandwidth product.

Furthermore, in an avalanche photodetector structure which uses a silicon planar waveguide to transmit optical signals into the structure, and then couples light carrying signals into a germanium layer, the silicon material thereof, on one hand, is used as a waveguide for optical transmission, and on the other hand, is doped with P-type or N-type to form an electric field to extract photogenerated carriers. The absorption region of germanium material is also doped with P-type or N-type. These doping will induce optical absorption loss, and then reduce quantum efficiency of the detector.

On this basis, the following technical solutions of the embodiments of the disclosure are proposed.

An embodiment of the disclosure provides a laterally structured avalanche photodetector, including a substrate, a first epitaxial growth layer, and a second epitaxial growth layer. The substrate includes a first semiconductor material region in which an avalanche region of the avalanche photodetector is formed. The first epitaxial growth layer is formed on the substrate with a second semiconductor material different from a first semiconductor material, and is formed as an absorption region of the avalanche photodetector, and has an upper surface used as an optical absorption surface which is protruded from an upper surface of the first semiconductor material region, and a lower surface lower than the upper surface of the first semiconductor material region, and the absorption region and the avalanche region are arranged at an interval along a first direction parallel to a substrate plane. The second epitaxial growth layer is formed on the substrate with the first semiconductor material, and includes at least a first part and a second part which are located at two sides of the absorption region along the first direction, and cover two sidewalls of the first epitaxial growth layer protruding above the first semiconductor material region respectively, and are formed as at least a part of a first charge region and at least a part of a second charge region respectively. The first charge region, the absorption region, the second charge region and the avalanche region at least partially overlap in the first direction.

Please refer to FIG. 1A and FIG. 1B below, for details. As shown in the figures, the avalanche photodetector includes a substrate which includes a first semiconductor material region.

Here the substrate may be a simple substance semiconductor material substrate (such as a silicon (Si) substrate, a germanium (Ge) substrate, or the like), a composite semiconductor material substrate (such as a silicon germanium (SiGe) substrate, or the like), or a SOI substrate, a germanium on insulator (GeOI) substrate, or the like. Embodiments of the disclosure take the SOI substrate as an example to illustrate the substrate. The first semiconductor material region is an area where a top silicon layer 103 of the SOI substrate is located. The substrate further includes a buried oxygen layer 102 and a bottom silicon layer 101 located under the top silicon layer 103. For example, the buried oxygen layer 102 is a silicon dioxide layer. The bottom silicon layer 101 may have a thicker thickness than the top silicon layer 103. It should be understood that in order to make each layer structure clearly shown in the figures, size proportion relationship of each layer structure may be inconsistent with that of actual structures.

In an embodiment where the substrate is the simple substance semiconductor material substrate, the first semiconductor material region is a partial region of the substrate close to an upper surface layer.

The first semiconductor material region is formed with a multiplication region 185 of the avalanche photodetector therein. Here the multiplication region of the avalanche photodetector refers to an area where multiplication of carriers occurs. The absorption region of the avalanche photodetector may convert incident optical signals into multiple electron-hole pairs which flow to electrodes under the action of electric field to form photocurrent. The multiplication region may further amplify the photocurrent formed in the absorption region by the way of avalanche multiplication, then photodetection is implemented by a pair of metal electrodes conducting the photocurrent.

Since theoretically, any semiconductor materials may be used in the multiplication region, the first semiconductor material is not strictly limited here. In an embodiment where the substrate is a simple substance Si substrate or a SOI substrate, the first semiconductor material is Si.

In an embodiment of the disclosure, the multiplication region of the avalanche photodetector is a generalized concept, which may be used as a general term for areas where multiplication of carriers occurs. As a specific implementation, the multiplier region may include a P+ doped region, an I-intrinsic region, and a N+ doped region arranged sequentially in a direction from close to the absorption region to far away from the absorption region. Among them, the I-intrinsic region is an area where collision ionization occurs specifically to produce electron-hole pairs, and the P+ doped region may also be referred as a charge region. In order to distinguish from the charge region in the embodiments of the disclosure, the region where collision ionization occurs specifically to produce electron-hole pairs is referred as the avalanche region. It should be understood that this is not contrary to names of terms commonly used in the art, but uses a general and narrow concept in the art.

Specifically, the avalanche region may be an I-intrinsic region. Further referring to FIG. 1A, the multiplication region 185 includes a second charge region 114, a second I-intrinsic region (avalanche region) 115, and an N+ doped region 116.

In this way, in the embodiments of the disclosure, an avalanche region of the avalanche photodetector is formed in the first semiconductor material region (see the second I-intrinsic region 115 in FIG. 1A, for details).

A first epitaxial growth layer 120 is formed on the substrate with a second semiconductor material different from a first semiconductor material. The first epitaxial growth layer 120 is formed as an absorption region 180 of the avalanche photodetector. An upper surface of the first epitaxial growth layer 120 is an optical absorption surface which is protruded from an upper surface of the first semiconductor material region. That is, the upper surface of the first epitaxial growth layer 120 is higher than the upper surface of the first semiconductor material region (see 103 in the figures). A lower surface of the first epitaxial growth layer 120 is lower than the upper surface of the first semiconductor material region (see 103 in the figures). In this way, the absorption region 180 and the multiplication region 185 at least partially overlap in a direction along a substrate plane.

Here the substrate may include a top surface at a front side and a bottom surface at a back side opposite to the front side. A direction perpendicular to the top and bottom surfaces of the substrate is defined to be a second direction, by ignoring flatness of the top and bottom surfaces. The second direction is also a stacking direction of subsequent deposition of each layer structure on the substrate, or referred to a height direction of the device. A plane where the top and bottom surfaces of the substrate are located, or strictly speaking, a center plane in a thickness direction of the substrate, is determined as the substrate plane. A direction parallel to the substrate plane is the direction along the substrate plane. A first direction and a third direction intersecting with each other are defined in a direction of the substrate plane, and for example, the first direction and the third direction are two directions perpendicular to each other. In the embodiment, the first direction is a direction in which the absorption region and the multiplication region are arranged sequentially/a device width direction, or a current movement direction, and the third direction is a propagation direction of the optical signal.

It should be understood that the laterally structured avalanche photodetector refers to an avalanche photodetector that applies voltage to the absorption region and the avalanche region based on a lateral electric field, thereby extracting photogenerated carriers through the lateral electric field and forming current. Here "lateral" may specifically refer to the first direction in the embodiments of the disclosure. In other words, in the first direction, two ends of the absorption region and the avalanche region (specifically, two ends of the first charge region, the absorption region, the second charge region and the avalanche region) are applied with voltage to implement photodetection.

The absorption region and the avalanche region are arranged at an interval along a first direction parallel to a substrate plane.

In the embodiment, the lower surface of the first epitaxial growth layer is lower than an upper surface of the top silicon layer, so that the formed absorption region and the multiplication region at least partially overlap in the direction along the substrate plane, and specifically, the formed absorption region and the avalanche region at least partially overlap in the direction along the substrate plane. That is, projections of the absorption region and the avalanche region in a plane along a direction perpendicular to the substrate plane (such as a plane determined by the second direction and the third direction) at least partially overlap. In this way, the generated photocurrent may move along a linear direction substantially parallel to the substrate plane (such as the first direction), making a more uniform distribution of electric field in the absorption region, facilitating transport of photogenerated carriers, and help to improve a gain bandwidth product.

Figure 1B:
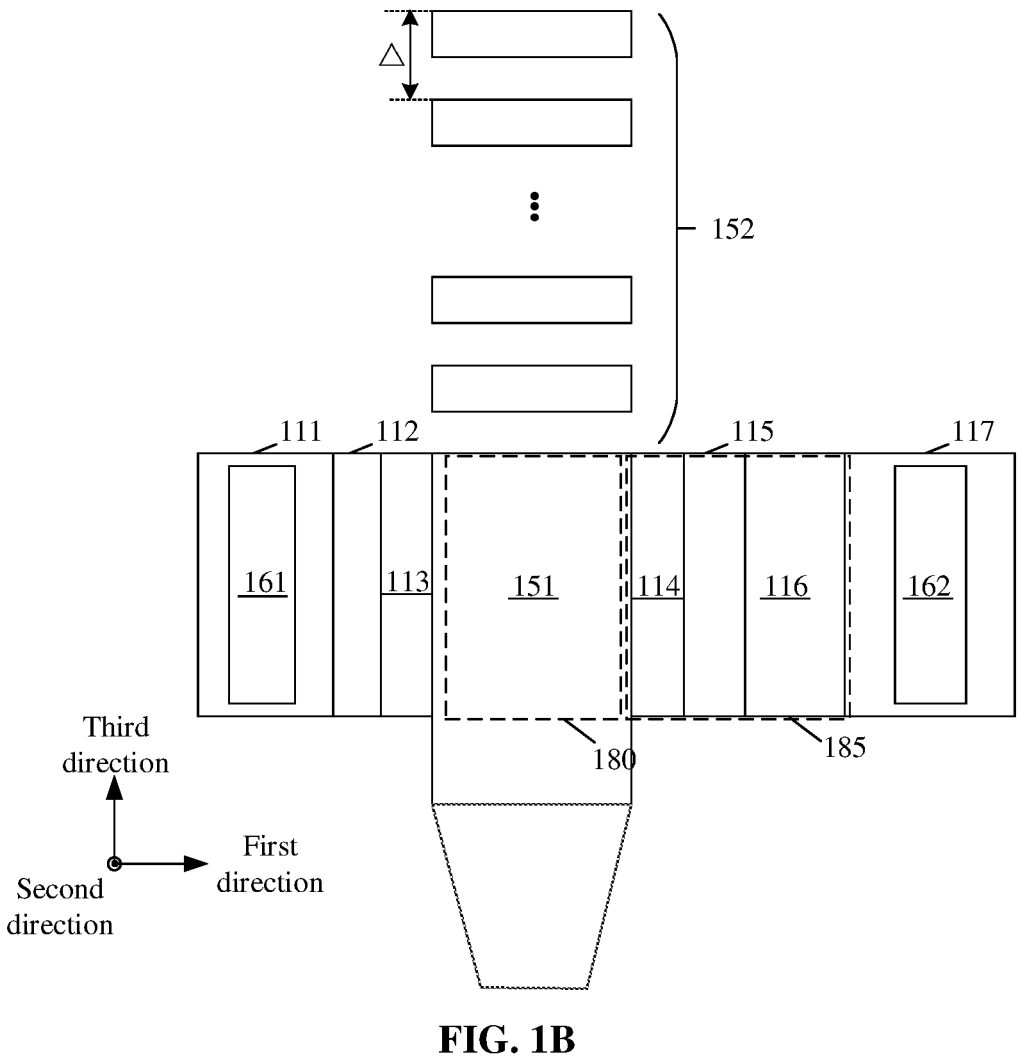
Figure 2A:
FIG. 2A to FIG. 2E are structural section views of different implementations of a second epitaxial growth layer in an avalanche photodetector.
Figure 2B:
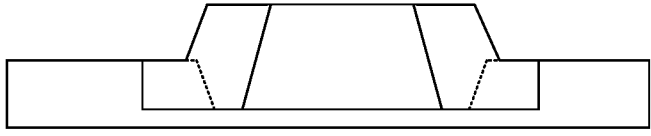
Figure 2C:
Figure 2D:
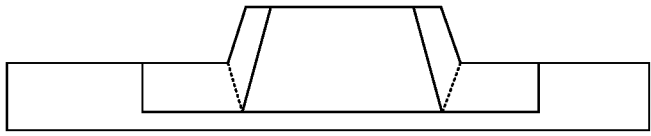
Figure 2E:

As shown in FIG. 1B, the absorption region 180 and the multiplication region 185 at least partially overlap in the direction along the substrate plane, which includes that the absorption region 180 and the multiplication region 185 are aligned with each other at boundaries along the third direction and substantially equal in width; and specifically includes that the absorption region 180 and the avalanche region are aligned with each other at boundaries along the third direction and substantially equal in width; furthermore, further includes that width of the absorption region 180 along the third direction is smaller than width of the avalanche region along the third direction.

As shown in FIG. 1A, in the embodiment, the lower surface of the first epitaxial growth layer 120 lower than the upper surface of the first semiconductor material region, specifically includes that a bottom end of the first epitaxial growth layer 120 is embedded in the top silicon layer 103. Here the first epitaxial growth layer 120 may be formed by epitaxial growth on a groove recessed in the top silicon layer 103. The bottom end of the first epitaxial growth layer 120 is higher than a lower surface of the top silicon layer 103, that is, there is a part of the first semiconductor material (top silicon layer material) under the first epitaxial growth layer 120, and the first epitaxial growth layer 120 does not contact the buried oxygen layer 102.

Still referring to FIG. 1A, the upper surface of the first epitaxial growth layer 120 is higher than the upper surface of the first semiconductor material region (the top silicon layer 103).

Here material of the first epitaxial growth layer is germanium for example, that is, the second semiconductor material is germanium. Therefore, the formed avalanche photodetector is a silicon germanium photodetector.

In the embodiments of the disclosure, the optical absorption surface of the absorption region is the upper surface of the first epitaxial growth layer (i.e. a surface of the first epitaxial growth layer far away from the substrate). Referring to FIG. 1A, the upper surface of the first epitaxial growth layer 120 is configured to absorb optical signals, and a sidewall of the first epitaxial growth layer 120 (a side surface or an interface between the first epitaxial growth layer 120 and the first semiconductor material) is configured to transmit electrical signals.

The first epitaxial growth layer (the absorption region) is provided with a size range of 150 nm~1500 nm in the first direction, a size range of 150 nm~600 nm in the second direction, and a size range of 1 μm~20 μm in the third direction. Here when describing size of the first epitaxial growth layer, size difference between the upper and lower surfaces of the first epitaxial growth layer in an epitaxial growth process may not be considered.

A second epitaxial growth layer 130 is formed on the substrate with the first semiconductor material. The second epitaxial growth layer 130 includes at least a first part and a second part which are located at two sides of the first epitaxial growth layer 120 along the first direction, and cover two sidewalls of the first epitaxial growth layer 120 protruding above the first semiconductor material region respectively, and are formed as at least a part of a first charge region 113 and at least a part of a second charge region 114 respectively.

In the embodiment, two sides of the absorption region include two charge regions. In this way, intensity of the electric field in the absorption region may be independently adjusted, which is conducive to reducing a dark current of the avalanche photodetector.

The first charge region and the second charge region are separately arranged at two sides of the absorption region, and are not connected with each other. A direction in which the first charge region, the absorption region and the second charge region are arranged sequentially (that is, the first direction) is a photocurrent transmission direction, and the photocurrent flows through the second charge region, the absorption region and the first charge region sequentially during transmission.

Material of each of the first charge region and the second charge region may be the first semiconductor material. Each of the first charge region and the second charge region are provided with P-type doping, specifically, a P+ doped region for example. In a specific embodiment, the first charge region and the second charge region are two P+ doped silicon charge regions located at two sides of a germanium absorption region respectively.

In a specific embodiment, the first charge region and the second charge region may be ion implanted respectively according to adjustment requirements of intensities of electric fields at two sides of the absorption region. The first charge region and the second charge region have different ion doping concentrations.

Each of the first charge region and the second charge region is provided with a size range of 50 nm~400 nm in the first direction, a size range of 100 nm~500 nm in the second direction (specifically, which may be decided by a structure size and doping depth of a position where they are located together), and a size range of 1 μm~20 μm in the third direction. Sizes of the first charge region, the second charge region and the first epitaxial growth layer in the third direction may be equal.

Referring to FIG. 1A, an upper surface of the second epitaxial growth layer 130 is at least partially coplanar with the upper surface of the first epitaxial growth layer 120. The first part and the second part of the second epitaxial growth layer 130 are formed as at least a part of the first charge region 113 and at least a part of the second charge region 114 respectively, which should be understood as follows. The first part and the second part are formed as a complete first charge region 113 and a complete second charge region 114 respectively, or as a part of the first charge region 113 and a part of the second charge region 114 respectively.

In a specific embodiment, the second epitaxial growth layer 130 is located between the first semiconductor material region and the first epitaxial growth layer 120. One side of the second epitaxial growth layer 130 is contacted with the first semiconductor material region, and the other side of the second epitaxial growth layer 130 is contacted with a respective one of the sidewalls of the first epitaxial growth layer 120.

The second epitaxial growth layer is provided with P-type doping.

The upper surface of the second epitaxial growth layer is at least partially coplanar with the upper surface of the first epitaxial growth layer. The second epitaxial growth layer covers the sidewalls of the first epitaxial growth layer. It may be understood that the upper surface of the second epitaxial growth layer is at least partially coplanar with the upper surface of the first epitaxial growth layer, which may be implemented by a flattening process, specifically a chemical mechanical grinding (CMP) process for example. The second epitaxial growth layer covers the sidewalls of the first epitaxial growth layer, which specifically means that the sidewalls of the first epitaxial growth layer are completely covered by the second epitaxial growth layer, and the first epitaxial growth layer does not have an exposed sidewall region.

Material of the second epitaxial growth layer is the same as that of the first semiconductor material region on the substrate. Therefore, the second epitaxial growth layer and the first semiconductor material region may be used as indistinguishable material regions subsequently, and boundary between them may not be clearly divided.

FIG. 2A to FIG. 2E are structural section views of different implementations of a second epitaxial growth layer in an avalanche photodetector. In each of FIG. 2A to FIG. 2E, the first charge region and the second charge region are shown as solid boundary lines respectively, and dotted lines in the solid boundary lines indicate interface between the second epitaxial growth layer (specifically, the first part and the second part) and the substrate (specifically, the top silicon layer) inside the first charge region or the second charge region. In the embodiment shown in FIG. 2A, a lower surface of the second epitaxial growth layer may be contacted with the top silicon layer, and is substantially parallel to the upper surface of the top silicon layer. The upper surface of the second epitaxial growth layer may be coplanar with the upper surface of the first epitaxial growth layer. The sidewall close to the first epitaxial growth layer is contacted with the first epitaxial growth layer (that is, the second epitaxial growth layer covers the sidewall of the first epitaxial growth layer), and a part of the sidewall far away from the first epitaxial growth layer is contacted with the top silicon layer (dotted lines in the figure), and the other part of the sidewall is protruded above the upper surface of the top silicon layer. The second epitaxial growth layer has a section of pentagon shape. In the embodiment shown in FIG. 2B, the lower surface of the second epitaxial growth layer may be coplanar with the top silicon layer, and is substantially parallel to the upper surface of the top silicon layer. The upper surface of the second epitaxial growth layer may be coplanar with the upper surface of the first epitaxial growth layer. The sidewall close to the first epitaxial growth layer is contacted with the first epitaxial growth layer (that is, the second epitaxial growth layer covers the sidewall of the first epitaxial growth layer), and a part of the sidewall far away from the first epitaxial growth layer is contacted with the top silicon layer (dotted lines in the figure), and the other part of the sidewall is protruded above the upper surface of the top silicon layer. The second epitaxial growth layer further includes a part located above the top silicon layer. In the embodiment shown in FIG. 2C, the second epitaxial growth layer does not include a lower surface substantially parallel to the upper surface of the top silicon layer, and the lower half portion of the second epitaxial growth layer is inserted between the first epitaxial growth layer and the top silicon layer in an inverted triangle. The second epitaxial growth layer further includes a part located above the top silicon layer. Differences between the second epitaxial growth layer in the embodiment shown in FIG. 2D and the second epitaxial growth layer in the embodiment shown in FIG. 2C lie in that the second epitaxial growth layer in FIG. 2D does not include a part covering onto the top silicon layer; the second epitaxial growth layer has a section of quadrilateral shape; the upper surface of the second epitaxial growth layer may be coplanar with the upper surface of the first epitaxial growth layer; the sidewall close to the first epitaxial growth layer is contacted with the first epitaxial growth layer (that is, the second epitaxial growth layer covers the sidewall of the first epitaxial growth layer); a part of the sidewall far away from the first epitaxial growth layer is contacted with a sidewall of the top silicon layer (dotted lines in the figure), and the other part of the sidewall is protruded above the upper surface of the top silicon layer; and the lower half portion of the second epitaxial growth layer is inserted between the first epitaxial growth layer and the top silicon layer in an inverted triangle. In the embodiments shown in FIG. 2A to FIG. 2D, a part of the top silicon layer and the second epitaxial growth layer are doped to form the charge region, so that the second epitaxial growth layer may be formed as a part of the charge region (the first part and the second part are formed as a part of the first charge region and a part of the second charge region respectively). In the embodiment shown in FIG. 2E, the second epitaxial growth layer is doped to form the charge region, so that the second epitaxial growth layer may be formed as the whole charge region (the first part and the second part are formed as a first charge region and the second charge region respectively). The part of the first semiconductor material region contacted with the second epitaxial growth layer may be the avalanche region. The first epitaxial growth layer is formed as the absorption region. It may be understood that the above embodiments may be implemented by adjusting sizes and locations of masks during formation of respective structures.

Continuing to refer to FIG. 1A, the first semiconductor material region (the top silicon layer 103) is further formed with a first contact region 111 and a second contact region 117 with opposite doping types. The first charge region 113, the absorption region 180, the second charge region 114 and the avalanche region (referring to 115 in the figure) are located between the first contact region 111 and the second contact region 117 in the first direction. The first contact region 111 is a P++ contact region for example, and the second contact region 117 is a N++ contact region for example. A first I-intrinsic region 112 may also be included between the first contact region 111 and the first charge region 113. In this way, the first contact region 111, the first I-intrinsic region 112, the first charge region 113, the second charge region 114, the second I-intrinsic region 115, the N+ doped region 116 and the second contact region 117 are formed sequentially on the first semiconductor material region along the first direction (i.e. a photocurrent movement direction). The absorption region 180 (the first epitaxial growth layer 120) is located between the first charge region 113 and the second charge region 114.

Here the first I-intrinsic region 112 is located between the first contact region 111 and the first charge region 113, and the second I-intrinsic region 115 is located between the second charge region 114 and the N+ doped region 116. Each of the first I-intrinsic region 112 and the second I-intrinsic region 115 is provided with a size range of 60 nm~600 nm in the first direction, and may have a size in the third direction equal to one of: a size of the first charge region, the second charge region, or the first epitaxial growth layer in the third direction.

Each of the P++ contact region and the N++ contact region has a doping concentration range of $1 \times 10^{20}/cm^3 \sim 5 \times 10^{20}/cm^3$, each of the P+ doped region and the N+ doped region has a doping concentration range of $2—10^{17}/cm^3 \sim 5 \times 10^{18}/cm^3$, the I-intrinsic region has a concentration $\leq 1 \times 10^{17}/$ $cm^3$, and the absorption region has a doping concentration $\leq 5 \times 10^{17}/cm^3$. Among them, the absorption region may be an intrinsic region or a lightly doped region.

A distance from any one of the P++ contact region or the N++ contact region to the absorption region in the first direction is $\geq 1.5$ μm.

In an embodiment, the first epitaxial growth layer in the avalanche photodetector absorbs optical signals through the upper surface. The avalanche photodetector may further include an optical waveguide arranged to be located on the first epitaxial growth layer and separated from the first epitaxial growth layer by a preset distance. A coupling direction along which the optical waveguide couples the optical signal to the first epitaxial growth layer is substantially perpendicular to the direction of the substrate plane.

Continuing to refer to FIG. 1A and FIG. 1B, the avalanche photodetector further includes an optical waveguide 150 which extends above the first epitaxial growth layer 120, and is separated from the upper surface of the first epitaxial growth layer 120 by a preset distance, and includes at least a first waveguide part 151 and a second waveguide part 152. Here the first waveguide part 151 is configured to couple an optical signal to the first epitaxial growth layer 120, and includes a first end for the optical signal to be input and a second end opposite to the first end along a propagation direction of the optical signal (the third direction in the figures). The second waveguide part 152 is arranged outside the second end along the propagation direction of the optical signal, and is formed as a distributed Bragg reflector structure.

It may be understood that on one hand, an independent optical waveguide structure is used to transmit optical signals, so that absorption loss caused by using a silicon flat waveguide for simultaneous P-type or N-type doping may be avoided; on the other hand, a part of the optical waveguide is formed as the distributed Bragg reflector structure, so that quantum efficiency of the detector may be improved without increasing length of an active region.

Specifically, material of the optical waveguide may be silicon nitride, that is, the optical waveguide may be a silicon nitride optical waveguide. In some other embodiments, the material of the optical waveguide may also be silicon.

In a specific embodiment, the distributed Bragg reflector structure has a periodic width of 200 nm~500 nm, and material of the optical waveguide has a duty cycle of 30~70%. In an embodiment where the material of the optical waveguide is silicon nitride or silicon, the silicon nitride or silicon material in the distributed Bragg reflector structure has a duty cycle of 30~70%. As shown in FIG. 1B, 30~70% of a cycle width Δ is material of the optical waveguide, and the remaining 70~30% of the cycle width is another material different from the optical waveguide, such as silicon dioxide.

The preset distance between the optical waveguide 150 and the upper surface of the first epitaxial growth layer 120 has a range of 100 nm~1000 nm.

The first waveguide part 151 is provided with a size range of 300 nm~2000 nm in the first direction, a size range of 80 nm~800 nm in the second direction, and a size range of 1 μm~35 μm in the third direction. Among them, size of the first waveguide part 151 in the first direction should be larger than size of the first epitaxial growth layer 120 in the first direction. A vertical projection of the first end of the first waveguide part 151 on the substrate may fall outside a range of a vertical projection of the first epitaxial growth layer 120 on the substrate, and a vertical projection of the second end of the first waveguide part 151 on the substrate may fall outside the range of the vertical projection of the first epitaxial growth layer 120 on the substrate, or the vertical projection of the second end on the substrate may be aligned with corresponding boundaries of the vertical projection of the first epitaxial growth layer 120 on the substrate.

The avalanche photodetector further includes a first metal electrode 161 and a second metal electrode 162. The first metal electrode 161 and the second metal electrode 162 are arranged along a direction perpendicular to the substrate plane. The first semiconductor material region is further formed with a first contact region 111 and a second contact region 117 which have opposite doping types and are contacted with the first metal electrode 161 and the second metal electrode 162 respectively.

It should be understood that the first contact region 111 and the second contact region 117 have opposite doping types, and accordingly, the first metal electrode 161 and the second metal electrode 162 have opposite electrical properties, that is, one of the two electrodes is a positive electrode and the other is a negative electrode. Therefore, a lateral electric field is applied between the first contact region 111, the first I-intrinsic region 112, the first charge region 113, the absorption region 180, the second charge region 114, the second I-intrinsic region 115, the N+ doped region 116 and the second contact region 117.

A distance between any one of the first metal electrode 161 or the second metal electrode 162 and the optical waveguide 150 is equal to or greater than 500 nm. In this way, the first metal electrode 161 or the second metal electrode 162 may be avoided from absorbing optical signals and generating heat energy to cause loss.

A specific implementation of the avalanche photodetector is introduced below.

The avalanche photodetector may include a silicon substrate (such as the bottom silicon layer 101), a silicon dioxide material region (such as the buried oxygen layer 102), a silicon material region (such as the top silicon layer 103), a germanium material absorption region (such as the first epitaxial growth layer 120/the absorption region 180), a silicon nitride optical waveguide region (such as the optical waveguide 150), an input optical port, and two metal electrode regions (such as the first metal electrode 161 and the second metal electrode 162).

Here the silicon material region includes a P++ doped region (such as the first contact region 111) connected with the first metal electrode 161, a P+ doped charge region (such as the first charge region 113 and the second charge region 114), a first I-intrinsic region 112, a second I-intrinsic region 115, a N+ doped region 116, and a N++ doped region (such as the second contact region 117) connected with the second metal electrode 162.

The silicon nitride optical waveguide region includes a strip optical waveguide (such as the first waveguide part 151) and a distributed Bragg reflector (such as the second waveguide part 152).

The germanium material absorption region is embedded in the P+ doped charge region.

The strip optical waveguide of the silicon nitride optical waveguide region is located above the germanium material absorption region, with a certain interval there-between.

The two metal electrodes are connected to the P++ doped region and N++ doped region in the silicon material region respectively, to form a lateral electric field applied to the germanium material absorption region and the silicon material region.

In this way, light slowly enters the germanium material absorption region through the silicon nitride optical waveguide region and through evanescent wave coupling, and the germanium material absorbs photons to generate carriers. The externally applied electric field extracts photogenerated carriers to form current and implement photoelectric signal conversion. The avalanche photodetector in this implementation is a lateral (or referred to as "transverse") avalanche photodetector of a silicon germanium embedded type. Thanks to the germanium material absorption region embedded in the silicon material region and the slow and efficient coupling of silicon nitride and germanium, avalanche photodetection with high gain, large bandwidth and high quantum efficiency may be achieved.

The embodiments of the disclosure further provide a method for manufacturing a laterally structured avalanche photodetector, please refer to FIG. 3 for details. As shown in the figure, the method includes the following operations.

In operation 201, a substrate is provided, the substrate includes a first semiconductor material region.

In operation 202, an etching process is performed on the first semiconductor material region, to form a groove extending into interior of the first semiconductor material region.

In operation 203, a selective epitaxial growth process is performed to form a first epitaxial growth layer in the groove, material of the first epitaxial growth layer is a second semiconductor material different from a first semiconductor material.

The first epitaxial growth layer is formed as an absorption region of the avalanche photodetector, and has an upper surface used as an optical absorption surface which is protruded from an upper surface of the first semiconductor material region.

In operation 204, the selective epitaxial growth process is performed again to form a second epitaxial growth layer with the first semiconductor material.

The second epitaxial growth layer includes at least a first part and a second part which are located at two sides of the first epitaxial growth layer along a first direction parallel to a substrate plane, and cover two sidewalls of the first epitaxial growth layer protruding above the first semiconductor material region respectively.

In operation 205, a selective doping process is performed to form an avalanche region in the first semiconductor material region, and the first part and the second part of the second epitaxial growth layer are formed as at least a part of a first charge region and at least a part of a second charge region respectively.

The first charge region, the absorption region, the second charge region and the avalanche region at least partially overlap in the first direction.

The avalanche photodetector and the method for manufacturing the same provided in the embodiments of the disclosure will be further described in detail below in combination with structural section views of devices during manufacturing of an avalanche photodetector shown in FIG. 4A to FIG. 4I.

Firstly, operation 201 is performed. A substrate is provided, the substrate includes a first semiconductor material region.

Referring to FIG. 4A, a substrate is provided. The substrate may be a simple substance semiconductor material substrate (such as a Si substrate, a Ge substrate, or the like), a composite semiconductor material substrate (such as a SiGe substrate, or the like), or a SOI substrate, a GeOI substrate, or the like.

Embodiments of the disclosure take the SOI substrate as an example to illustrate the substrate. The first semiconductor material region is an area where a top silicon layer 103 of the SOI substrate is located. The substrate further includes a buried oxygen layer 102 and a bottom silicon layer 101 located under the top silicon layer 103. For example, the buried oxygen layer 102 is a silicon dioxide layer. The bottom silicon layer 101 may have a thicker thickness than the top silicon layer 103.

In an embodiment, the substrate is the simple substance semiconductor material substrate, the first semiconductor material region is a partial region of the substrate close to an upper surface layer.

Next, operation 202 is performed. An etching process is performed on the first semiconductor material region, to form a groove extending into interior of the first semiconductor material region.

Referring to FIG. 4B, in an embodiment where the substrate is a SOI substrate, the operation of performing the etching process on the first semiconductor material region specifically includes the following operations. A groove with a bottom end located in the top silicon layer 103 is formed. Specifically, a lower surface of the groove may be higher than a lower surface of the top silicon layer 103, so that the buried oxygen layer 102 is not exposed.

In an actual process, an area required to be etched to form the groove may be defined by patterning, and then the etching process is performed. Specifically, processes such as photolithography, electron beam exposure and etching (such as inductive plasma etching), or the like may be used to remove a certain thickness of silicon, thereby forming the groove.

Next, operation 203 is performed. A selective epitaxial growth process is performed to form a first epitaxial growth layer in the groove, material of the first epitaxial growth layer is a second semiconductor material different from a first semiconductor material.

Figure 4C:
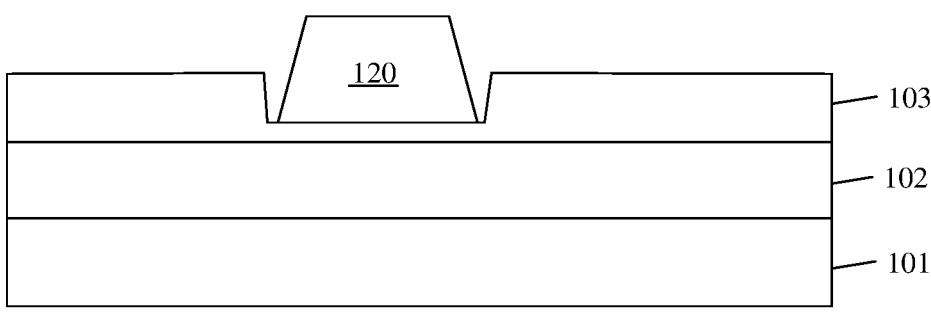

Referring to FIG. 4C, a first epitaxial growth layer 120 is formed on the top silicon layer 103 exposed by the groove, and material of the first epitaxial growth layer 120 is a second semiconductor material different from a first semiconductor material.

In an embodiment where the first semiconductor material is silicon, the second semiconductor material is germanium.

In an actual process, high-quality polycrystalline germanium material may be selectively grown in the groove region by using molecular beam epitaxial growth or other processes.

By controlling sizes and locations of masks defining a formation region of the first epitaxial growth layer, it may be achieved that a lower surface of the first epitaxial growth layer covers only a partial region of the lower surface of the groove, or covers all the region of the lower surface of the groove.

Continuing to refer to FIG. 4C, the operation of forming the first epitaxial growth layer 120 includes the following operations. A first epitaxial growth layer 120 with an upper surface higher than the upper surface of the first semiconductor material region (see 103 in the figure).

In an actual process, after performing the epitaxial growth process to grow the first epitaxial growth layer of the second semiconductor material, the operation of flattening the upper surface of the second semiconductor material may also be included, specifically, CMP process may be used to make the first epitaxial growth layer have a substantially flat upper surface.

Next, operation 204 is performed. The selective epitaxial growth process is performed again to form a second epitaxial growth layer with the first semiconductor material.

Figure 4D:
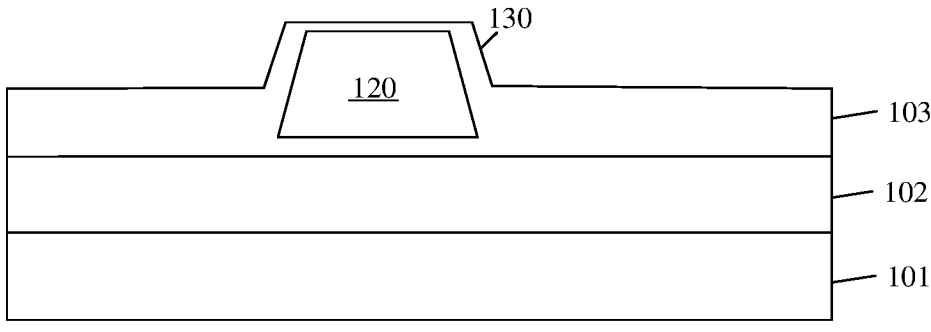
Figure 4E:
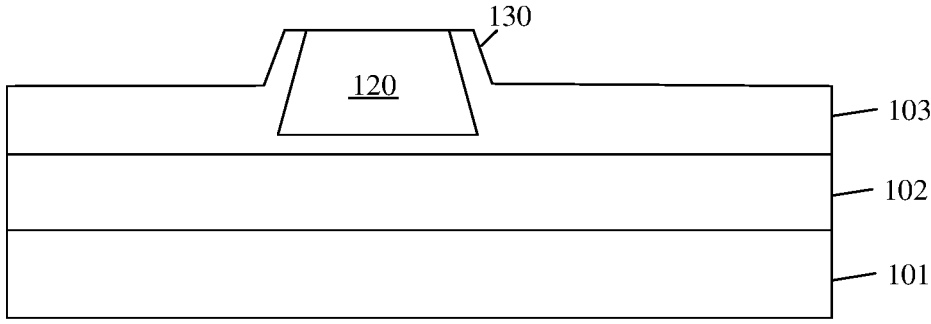

Here please refer to FIG. 4D and FIG. 4E. Firstly, referring to FIG. 4D, in this embodiment, the groove is not be filled with the first epitaxial growth layer 120. The selective epitaxial growth process is performed again, so that the first semiconductor material, such as polysilicon material, is selectively grown on the groove and the first epitaxial growth layer 120, to form a second epitaxial growth layer 130 which fills the groove and covers sidewalls of the first epitaxial growth layer 120. The second epitaxial growth layer 130 may cover the whole first epitaxial growth layer 120 firstly.

By controlling sizes and locations of masks defining a formation region of the second epitaxial growth layer, it may be achieved that the second epitaxial growth layer is totally located in the groove, or partially located in the groove and partially located on the upper surface of the first semiconductor material region. Furthermore, corresponding to the first epitaxial growth layer located in the groove, only a partial region of the lower surface of the groove is covered, or all the region of the lower surface of the groove is covered, and a lower surface of the second epitaxial growth layer may be contacted with upper and side surfaces of the first semiconductor material region exposed by the groove, or may only be contacted with the side surfaces of the first semiconductor material region exposed by the groove. Here the formed specific structure may refer to relevant descriptions in FIG. 2A to FIG. 2E and the above embodiments of the avalanche photodetector, which will not be repeated here.

Next, please refer to FIG. 4E. A flattening process is performed so that an upper surface of the second epitaxial growth layer 130 is at least partially coplanar with the upper surface of the first epitaxial growth layer 120.

In an actual process, CMP process may be used to process the polysilicon material above the germanium material, so that only the polysilicon at two sides of the germanium material may be retained.

Material of the second epitaxial growth layer is the same as that of the first semiconductor material region on the substrate. Therefore, the second epitaxial growth layer and the first semiconductor material region may be used as indistinguishable material regions subsequently, and boundary between them may not be clearly divided.

The second epitaxial growth layer includes at least a first part and a second part which are located at two sides of the first epitaxial growth layer along the first direction, and cover two sidewalls of the first epitaxial growth layer protruding above the first semiconductor material region respectively.

The second epitaxial growth layer is located between the first semiconductor material region and the first epitaxial growth layer, and has one side contacted with the first semiconductor material region and the other side contacted with a respective one of the sidewalls of the first epitaxial growth layer.

Next, operation 205 is performed. A selective doping process is performed to form an avalanche region in the first semiconductor material region, and the first part and the second part of the second epitaxial growth layer are formed as at least a part of a first charge region and at least a part of a second charge region respectively.

Figure 4F:
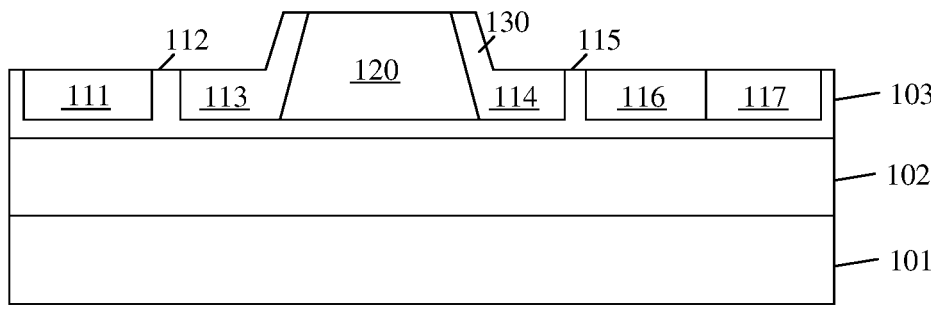

Please refer to FIG. 4F. The operation of performing the selective doping process may include the following operations. P-type doping is performed on the second epitaxial growth layer 130. Here since the second epitaxial growth layer 130 and the first semiconductor material region are not clearly divided, the P-type doping may also be partially performed on a partial region of the first semiconductor material region in contact with the second epitaxial growth layer 130.

A P+ doped charge region adjacent to the absorption region is formed by performing the P-type doping. The charge region may be used as a part of the multiplication region.

In an embodiment, the P-type doping may be performed at two sides of the absorption region, so that two charge regions are included at two sides of the absorption region. That is, the operation of performing the selective doping process may further include the following operations. A first charge region 113 and a second charge region 114 are formed at two sides of the first epitaxial growth layer 120 respectively.

Furthermore, the operation of performing the selective doping process may further include the following operations. A first contact region 111 and a second contact region 117 with opposite doping types are formed in the first semiconductor material region, and the first charge region 113, the absorption region 180, the second charge region 114 and the avalanche region (referring to 115 in the figure) are located between the first contact region 111 and the second contact region 117 in the first direction. The first contact region 111 is a P++ contact region for example, and the second contact region 117 is a N++ contact region for example.

The operation of performing the selective doping process may further include the following operations. A N+ contact region 116 is formed between the first epitaxial growth layer 120 and the second contact region 117, specifically between the charge region (the second charge region 114) and the second contact region 117.

At least an undoped I-intrinsic region (the second I-intrinsic region 115) is included between the charge region and the second contact region 117. In this way, the P+ doped region (the charge region), the I-intrinsic region (the avalanche region) and the N+ doped region arranged sequentially along a direction far away from the absorption region (the first epitaxial growth layer 120) constitute the multiplication region.

In this embodiment, a first I-intrinsic region 112 may also be included between the first contact region 111 and the first charge region 113. In this way, the first contact region 111, the first I-intrinsic region 112, the first charge region 113, the second charge region 114, the second I-intrinsic region 115, the N+ doped region 116 and the second contact region 117 are formed sequentially on the first semiconductor material region along the first direction. The absorption region 180 (the first epitaxial growth layer 120) is located between the first charge region 113 and the second charge region 114.

Here the first I-intrinsic region 112 is located between the first contact region 111 and the first charge region 113, and the second I-intrinsic region 115 is located between the second charge region 114 and the N+ doped region 116.

Figure 4G:
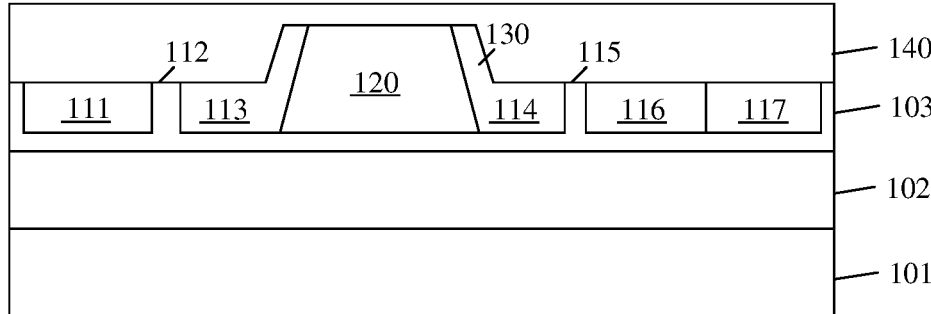

Next, please refer to FIG. 4G. A filler layer 140 is formed on the substrate, specifically on the first semiconductor material region, the first epitaxial growth layer, and the second epitaxial growth layer.

Material of the filler layer 140 may include silicon dioxide.

In an actual process, the filler layer 140 may be formed by depositing a certain thickness of silicon dioxide material and flattening it.

Next, the method further includes the following operations. An optical waveguide is formed, the optical waveguide extends above the first epitaxial growth layer, and is separated from the upper surface of the first epitaxial growth layer by a preset distance, and includes at least a first waveguide part and a second waveguide part. Here the first waveguide part is configured to couple an optical signal to the first epitaxial growth layer, and includes a first end for the optical signal to be input and a second end opposite to the first end along a propagation direction of the optical signal. The second waveguide part is arranged outside the second end along the propagation direction of the optical signal, and is formed as a distributed Bragg reflector structure.

Figure 4H:
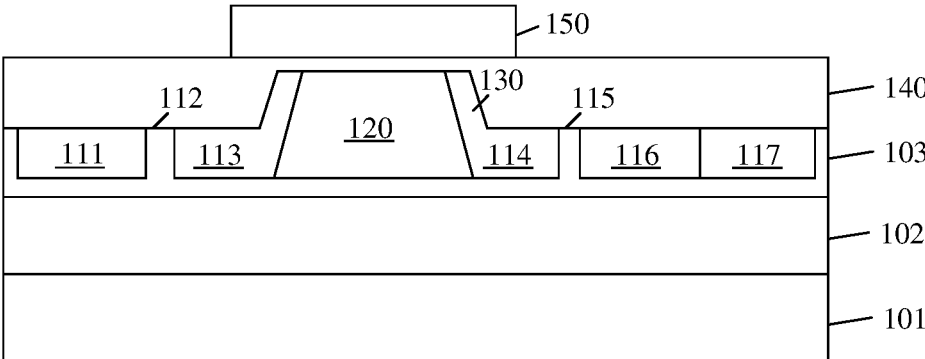

Referring to FIG. 4H, an optical waveguide 150 is formed.

In an actual process, an area required to form the optical waveguide may be defined on the filler layer 140 above the first epitaxial growth layer 120 through a patterned mask layer (not shown in the figure), and an optical waveguide material is grown in this region, for example, silicon nitride material or growth silicon material is specifically deposited in this region, to form the optical waveguide 150.

A specific structure of the formed optical waveguide 150 may refer to FIG. 1B, here the distributed Bragg reflector structure has a periodic width of 200 nm~500 nm, and material of the optical waveguide has a duty cycle of 30~70%.

Figure 4I:
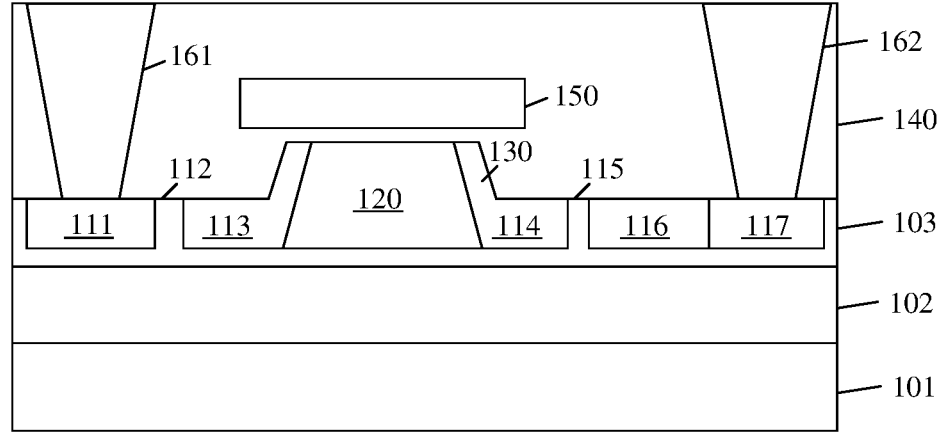

Next, please refer to FIG. 4I. The method further includes the following operations. A first metal electrode 161 and a second metal electrode 162 are formed, the first metal electrode 161 and the second metal electrode 162 are arranged in a direction perpendicular to the substrate plane (i.e. a second direction) and are contacted with the first contact region 111 and the second contact region 117 respectively, here a distance between any one of the first metal electrode 161 or the second metal electrode 162 and the optical waveguide 150 is equal to or greater than 500 nm.

Specifically, the above two metal electrodes may be fabricated by using processes such as photolithography and inductive plasma etching for windowing, deposition of metal materials under magnetron sputtering, or the like.

Upper surfaces of the first metal electrode 161 and the second metal electrode 162 should be higher than an upper surface of the optical waveguide 150. Specifically, it further includes: forming a filler layer on the optical waveguide 150; forming, in the filler layer, a window exposing the first contact region 111 and the second contact region 117 by using photolithography and etching (such as inductive plasma etching) or other processes; and filling the window with electrode materials (such as deposition of metal materials under magnetron sputtering) to form the first metal electrode 161 and the second metal electrode 162.

In this way, manufacturing of the avalanche photodetector is substantially completed. Some interconnection processes may be involved subsequently, which will not be further discussed here.

It should be noted that embodiments of the avalanche photodetector and embodiments of the method for manufacturing the avalanche photodetector provided in the embodiments of the disclosure belong to the same concept. The technical features in the technical solutions recorded in the embodiments may be combined arbitrarily without conflict. However, it is required to be further explained that combinations of technical features of the avalanche photodetector provided in the embodiments of the disclosure may already solve the technical problem to be solved in the disclosure. Therefore, the avalanche photodetector provided in the embodiments of the disclosure may not be limited by the method for manufacturing the avalanche photodetector provided in the embodiments of the disclosure, and any avalanche photodetector manufactured by the manufacturing method which may form the avalanche photodetector structure provided in the embodiments of the disclosure falls within the scope of protection of the disclosure.

The above descriptions are only optional embodiments of the disclosure and are not intended to limit the scope of protection of the disclosure. Any modification, equivalent replacement, improvement, or the like made within the spirit and principle of the disclosure should be contained in the scope of protection of the disclosure.

What is claimed is:

1. A laterally structured avalanche photodetector, comprising:

a substrate, comprising a first semiconductor material region in which an avalanche region of the avalanche photodetector is formed;

a first epitaxial growth layer, formed on the substrate with a second semiconductor material different from a first semiconductor material, and formed as an absorption region of the avalanche photodetector, and having an upper surface used as an optical absorption surface which is protruded from an upper surface of the first semiconductor material region, and a lower surface lower than the upper surface of the first semiconductor material region, and the absorption region and the avalanche region being arranged at an interval along a first direction parallel to a substrate plane; and a second epitaxial growth layer, formed on the substrate with the first semiconductor material, and comprising at least a first part and a second part which are located at two sides of the first epitaxial growth layer along the first direction, and cover two sidewalls of the first epitaxial growth layer protruding above the first semiconductor material region respectively, and are formed as at least a part of a first charge region and at least a part of a second charge region respectively, the first charge region, the absorption region, the second charge region and the avalanche region at least partially overlapping in the first direction.

2. The laterally structured avalanche photodetector of claim 1, wherein the substrate is a silicon on insulator (SOI) substrate, and the first semiconductor material region is an area where a top silicon layer of the SOI substrate is located;

the lower surface of the first epitaxial growth layer lower than the upper surface of the first semiconductor material region, specifically comprises that a bottom end of the first epitaxial growth layer is embedded in the top silicon layer.

3. The laterally structured avalanche photodetector of claim 2, wherein the first semiconductor material is silicon, and the second semiconductor material is germanium.

4. The laterally structured avalanche photodetector of claim 1, wherein the second epitaxial growth layer is located between the first semiconductor material region and the first epitaxial growth layer, and has one side contacted with the first semiconductor material region and the other side contacted with a respective one of the sidewalls of the first epitaxial growth layer.

5. The laterally structured avalanche photodetector of claim 4, wherein the first semiconductor material is silicon, and the second semiconductor material is germanium.

6. The laterally structured avalanche photodetector of claim 1, wherein the second epitaxial growth layer is provided with P-type doping.

7. The laterally structured avalanche photodetector of claim 1, wherein the first semiconductor material is silicon, and the second semiconductor material is germanium.

8. The laterally structured avalanche photodetector of claim 1, further comprising:

an optical waveguide, extending above the first epitaxial growth layer, and separated from the upper surface of the first epitaxial growth layer by a preset distance, and comprising at least a first waveguide part and a second waveguide part, wherein the first waveguide part is configured to couple an optical signal to the first epitaxial growth layer, and comprises a first end for the optical signal to be input and a second end opposite to the first end along a propagation direction of the optical signal, the second waveguide part is arranged outside the second end along the propagation direction of the optical signal, and is formed as a distributed Bragg reflector structure.

9. The laterally structured avalanche photodetector of claim 8, wherein the distributed Bragg reflector structure has a periodic width of 200 nm-500 nm, and material of the optical waveguide has a duty cycle of 30-70%.

10. The laterally structured avalanche photodetector of claim 8, further comprising:

a first metal electrode and a second metal electrode arranged along a direction perpendicular to the substrate plane, the first semiconductor material region further formed with a first contact region and a second contact region which have opposite doping types and are contacted with the first metal electrode and the second metal electrode respectively, and the first charge region, the absorption region, the second charge region and the avalanche region being located between the first contact region and the second contact region in the first direction, a distance between any one of the first metal electrode or the second metal electrode and the optical waveguide is equal to or greater than 500 nm.

* * * * *